United States Patent

Streckert et al.

[11] Patent Number: 5,681,511
[45] Date of Patent: Oct. 28, 1997

[54] HERMETIC CERAMIC COMPOSITE STRUCTURES

[75] Inventors: Holger H. Streckert; Kirk P. Norton; Clement P. C. Wong, all of San Diego, Calif.

[73] Assignee: General Atomics, San Diego, Calif.

[21] Appl. No.: 712,284

[22] Filed: Sep. 11, 1996

[51] Int. Cl.$^6$ .................................................. C04B 35/80
[52] U.S. Cl. ........................... 264/29.1; 264/29.7; 264/62; 264/81
[58] Field of Search .............................. 264/81, 62, 29.1, 264/29.7

[56] References Cited

U.S. PATENT DOCUMENTS

| | | | |
|---|---|---|---|
| 4,895,108 | 1/1990 | Caputo et al. | 264/81 |
| 4,980,202 | 12/1990 | Brennan et al. | 427/249 |
| 5,350,545 | 9/1994 | Streckert et al. | 264/81 |
| 5,354,580 | 10/1994 | Goela et al. | 264/81 |
| 5,472,650 | 12/1995 | Johnson et al. | 264/81 |

OTHER PUBLICATIONS

Caputo et al., "Fiber–Reinforced Ceramic Tubular Composites", (ORNL/TM–10466), pp. 1–47, Nov. 1988.
Chin et al., "The Structure of Chemical Vapor Deposited Silicon Carbide", Thin Solid Films, vol. 40, pp. 57–72, (1977).
Gulden, T.D., "Deposition and Microstrucutre of Vapor–Deposited Silicon Carbide", J. Am. Cer. Soc., vol. 51, No. 8, pp. 424–427, Aug. 1968.

*Primary Examiner*—James Derrington
*Attorney, Agent, or Firm*—Fitch, Even, Tabin & Flannery

[57] ABSTRACT

Methods for making hermetic silicon carbide matrix composite structures by CVI. A fibrous preform is created by winding strands of yarn of refractory fiber material helically about a graphite mandrel. Impregnation of the preform is carried out in a subatmospheric pressure zone at a pressure of about 700 Pa or less by maintaining a relatively slow flow of a mixture of helium and an alkyl chlorosilane through a coating zone heated to a temperature of between about 1100° to 1200° C. at a rate between about 2 and about 10 times the diffusion rate of the gaseous atmosphere in the fibrous preform. Coating is continued until silicon carbide impregnates the interstices of the fibrous preform and preferably deposits an outer layer of dense pore-free silicon carbide thereupon. The resultant structures are hermetic and provide leak-free containment of gases such as helium at temperatures of as high as 1,000° C. and a pressure differential as high as about 20 MPa.

20 Claims, 1 Drawing Sheet

HERMETIC CERAMIC COMPOSITE STRUCTURES

This invention relates to hermetic ceramic composite structures which are made by impregnation of a fibrous preform with a vaporous material that deposits silicon carbide throughout the preform to create a pressure-tight structure and more particularly, relates to winding fibrous yarn about a mandrel to form a tubular preform which is then impregnated via chemical vapor deposition using an alkylchlorosilane.

BACKGROUND OF THE INVENTION

Fusion power has the potential to be a safe and environmentally acceptable power source in the future, but to realize this potential, fusion power plants must control capital cost, achieve high reliability and high thermal performance, meet the low level waste requirement and minimize radioactive sources potentially available for release during normal and abnormal events. These objectives can be achieved by the proper selection of materials and suitable designs for the tokamak first wall, blanket, shield, and diverter components. High thermal efficiency can be achieved by operating a working fluid, such as helium, at a high exit temperature. As a part of the U.S. Fusion Power Plant ARIES studies of helium-cooled designs, SiC composites have been selected as the preferred structural materials. These helium-cooled design options may have coolant routing arranged in the poloidal or toroidal direction. For example, a configuration can be employed wherein the coolant enters the blanket in the poloidal direction, at the back plenum of the blanket, and then distributes through radially oriented pipes and flows toroidally, cooling the first wall and blanket, before returning to the back plenum of the blanket module. Metallic alloy and ceramic composite structural materials are well-suited for such structures, and SiC materials have particular advantages for fusion reactor applications due to their low neutron activation, low afterheat characteristics, low permeability of gases, especially helium, and excellent high-temperature mechanical properties at high neutron fluence.

Helium-cooled fission reactors have long been of interest to the nuclear power industry. More recently, such reactors have been proposed for naval propulsion, including submarine propulsion, for which composite materials will have many of the advantages of interest for fusion operations.

A key concern in the use of helium as the coolant is its capability to remove high surface heat fluxes. Because of helium's low density and correspondingly low volumetric specific heat, high pressures and high flow speeds are required, and thin-walled, tubular structures are needed which meet temperature and stress limits. It will likely be necessary to achieve superior heat transfer characteristics at high pressures and temperatures in a high neutron flux environment in order for helium-coolant technology to succeed in fusion and fission reactor applications. It has been known for a number of years that dense silicon carbide can be vapor-deposited from a gaseous atmosphere, such as a mixture of a carrier gas and methyltrichlorosilane (MTS) as reported in T. Gulden, "Deposition and Microstructure of Vapor-Deposited Silicon Carbide", *J. Am. Cer. Soc.*, 51 (8) 424–427 (1968). It is also known that chemical vapor deposition (CVD) can be carried out using a mixture of MTS and $H_2$ so as to produce dense silicon carbide. J. Chin et al., "The Structure of Chemical Vapor Deposited Silicon Carbide", *Thin Solid Films*, 40, 57–72 (1977).

In a report by Oak Ridge National Laboratory entitled "Fiber-Reinforced Ceramic Tubular Composites" (ORNL/TM-10466), November 1988, the making of ceramic fiber-ceramic matrix tubular composites is discussed wherein silicon carbide filament-wound preforms are infiltrated using Chemical Vapor Infiltration (CVI). Tubes were wound using a continuous tow of Nicalon fibers containing about 500 fibers per tow. A preform was wound about a slotted mandrel with adjacent tows essentially touching each other. A 10:1 mixture of hydrogen and MTS was caused to flow radially outward through the fibrous preform while heating to a temperature of about 1200° C. to deposit silicon carbide throughout the fibers. In some instances, the Nicalon fiber tows, comprising about 500 fibers having diameters of about 10 to 15 μm, were precoated with pyrolytic carbon. It was indicated that composite tubes containing about 50 volume % of fibers were infiltrated to about 90% of theoretical density, and that the highest density composites were fabricated from preforms having fibers wound 10° off the hoop direction. Relative permeability was measured with argon flow at a pressure of about 40 kPa across the tube wall. Permeability was found to generally vary from 1.5 to about 2 liters per minute, at room temperature, for a tube having an OD of about 5.1 cm, an ID of about 3.8 cm and a length of about 11–12 cm.

U.S. Pat. No. 4,980,202, issued Dec. 25, 1990, describes making preforms of Nextel or Nicalon fibers to which pyrolytic carbon coatings have been applied to the individual fibers. These preforms are densified by CVI, using a mixture of methyldichlorosilane (MDS) or some other alkylchlorosilane, e.g. three parts by volume of hydrogen to one part of MDS, while creating a thermal gradient across the fiber preform.

Prior art manufacturing methods do not achieve truly hermetic structures, and thus improvements in this respect have been sought, particularly to provide structures that will contain helium, a gas that is particularly difficult to contain.

It is desired to be able to provide structural components which are feasible to transport helium coolant at high pressures and high temperatures in a high neutron-flux environment and which exhibit good heat transfer.

SUMMARY OF THE INVENTION

It has been found that hermetic silicon carbide matrix composites that will be stable at high temperatures can be formed by chemical vapor infiltration (CVI) of suitable fibrous preforms under conditions that will provide a resultant structure of a relatively low thickness that is substantially impermeable to helium. These structures can be planar or tubular, and they are formed by creating preforms of refractory fiber yarns which are then subjected to CVI using a gaseous mixture of hydrogen and an alkylchlorosilane, such as methytrichlorosilane (MTS). CVI is carried out under subatmospheric pressure conditions where a pressure of about 700 Pa or less is maintained in a zone or enclosure through which a flow of the gaseous mixture is maintained at a rate equal to between about 2 and about 10 times the diffusion rate of the mixture in the gaseous preform, while maintaining the preform at a temperature at which selected silanes decompose, so as to deposit silicon carbide throughout the interstices of the yarn. Following impregnation of the preform, the flow of the gaseous mixture is continued for a time sufficient to deposit a layer of at least about 100 μm of silicon carbide on the surface thereof. More particularly, leak-tight ceramic matrix composite tubes can be fabricated from fibrous preforms formed by helically wrapping silicon carbide yarn about a cylindrical mandrel and then carrying out CVI using a mixture of hydrogen and MTS at a pressure of about 700 Pa or less and a temperature between about 1,000 and about 1,500° C. Preferably the gaseous mixture contains at least about five times as much hydrogen as MTS, and the flow rate of the gaseous mixture through the CVI zone is maintained at between about 2 and about 5 times its diffusion rate in the fibrous preform.

DETAILED DESCRIPTION OF THE PREFERRED EMBODIMENTS

Figures 1, 2:
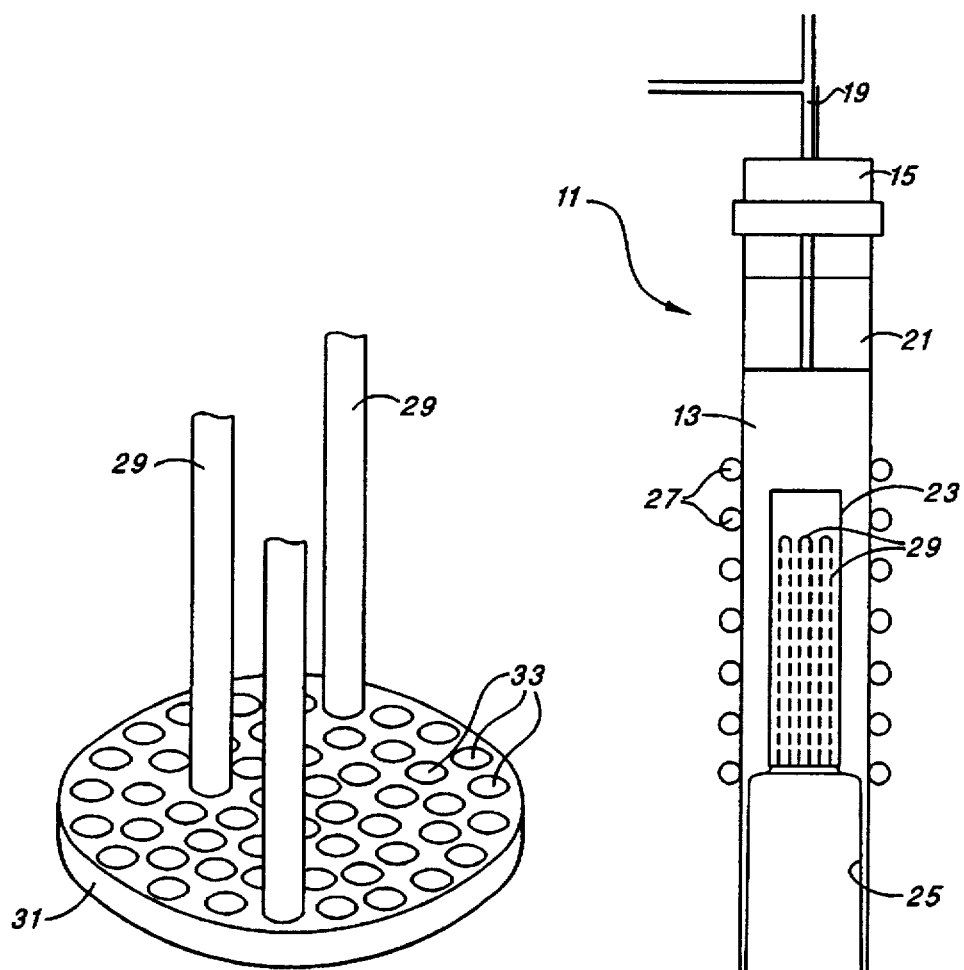
FIG. 1 is a schematic view of a chemical vapor infiltration reactor which is an example of apparatus that may be used in carrying out methods embodying various features of the invention.
FIG. 2 is an enlarged fragmentary perspective view of a portion of the apparatus shown in FIG. 1, particularly depicting the mandrel support arrangement.

Fibrous preforms are made using suitable yarns or tows of refractory fibers that will withstand a high temperature environment. Silicon carbide yarns are preferred, such as those sold under the trademark Nicalon by Nippon Carbon Co. of Tokyo, Japan; however, other suitable refractory fibers can alternatively be used. Such other fibers include carbon fibers, silicon oxycarbide fibers, silicon nitride fibers, silicon oxynitride fibers and refractory oxide fibers, such as aluminum oxide fibers, which may be in the form of relatively pure aluminum oxide or mullite, e.g. alumina-boria-silica fibers sold under the trademark Nextel by the 3M Company, St. Paul, Minn. These fibers are preferably employed in the form of continuous strands of yarn, with a strand or tow preferably being made up of between about 250 and 3000 individual fibers which usually have diameters in the range of about 5 to 20 µm, and more preferably tows having at least about 1000 fibers of diameters from about 10 to 15 µm are used.

The tensile strength of the fibers contributes greatly to the overall strength of the ceramic composite, and to preserve this strength in the final product, it is preferred to coat the exteriors of the individual fibers with a thin layer of porous silicon carbide, boron nitride, carbon or other interfacial coating material in order to provide an interface that prevents strong bonding between the fibers and the matrix material. A carbon interfacial coating of at least about 0.1 µm is generally considered adequate; however, pyrolytic carbon coatings of from about 0.2 to about 0.4 µm are preferably employed. Such interfacial coatings can be efficiently applied to the individual refractory fibers by deposition from a vaporous atmosphere containing a hydrocarbon, such as propane or propylene. For example, the individual fibers can be coated with about 0.2 µm pyrolytic carbon by passage through an atmosphere of 20% propylene and about 80% hydrogen or argon while heating the fibers to a temperature of about 1200° C.

The coated fibers are formed into preforms using any conventional method of fabrication. The fibers may be arranged sinuously to create planar structures or they can be helically wound about a mandrel of circular or noncircular cross-section, such as a graphite tube or rod of desired outer diameter, using conventional filamentary winding apparatus for handling such continuous yarns. Alternatively, parallel lengths of fibers may be arranged side-by-side in a planar array, or winding may be carried out about a mandrel having an oval or rectangular cross-section if desired. Preferably, winding is carried out so that adjacent strands of yarn overlap each other by an amount between about 0% and about 50% of the width of the strand. In other words, the disposition is such that adjacent strands either just touch one another, or there is overlapping by as much as about 50%. However, a greater overlap, e.g. about 50 to about 75%, may also be employed, particularly if the yarns have a relatively flat shape as opposed to a substantially circular cross-section. The graphite mandrel is preferably formed from a graphite material having a coefficient of thermal expansion (CTE) about equal, e.g. within about 10% thereof, to that of silicon carbide. Poco graphite, sold in the U.S. under the trade name POCO, is provided in at least 12 different grades. The grade designated PGCS-2 has a CTE of about $4.4 \times 10^{-6}$/°C. and is preferred.

The arrangement or the winding of the fibers is such as to form a preform of the desired thickness for creating a hermetic or gas-tight structure. In this respect, the thickness of the preform is generally at least about 0.1 mm and generally not greater than about 2 mm. When winding the usual yarns about a mandrel, to achieve a wall thickness of, for example, about 0.2 mm for a preform, one may employ one or two courses of helically-wound strands of Nicalon yarn. A wall thickness of about 0.2 mm is generally preferred for a tubular preform being formed upon a mandrel having a diameter between about 4 and about 10 mm, and if larger tubes are desired, a proportionately greater wall thickness is preferably employed. Generally, for tubes having such an interior diameter of about 4 to 10 mm, the wall thickness of the tubular preform will be between about 0.2 and about 1 mm.

Once the tubular preform is fabricated, it is subjected to CVI under careful conditions in a suitable reactor to create a hermetic structure. Illustrated in FIG. 1 is a reactor 11 which includes a main quartz containment vessel 13 wherein a vacuum is maintained; it is arranged with an upper inlet section 15 and a lower outlet section 17 although, if desired, the arrangement could be reversed. The outlet section 17 contains a conduit which leads to a vacuum pump or the like (not shown) which is designed to maintain the enclosure within the quartz containment tube 13, wherein the coating zone is located, at a low pressure, preferably about 700 Pa or less during the deposition process.

The upper inlet section 15 includes a coaxial supply pipe 19 through which hydrogen and gaseous silane are supplied which thoroughly mix in a gas baffle section 21 located in the upper region of the quartz containment vessel 13. Located coaxially within the containment vessel is a graphite susceptor 23 which creates the high temperature zone wherein the CVI coating takes place. The graphite susceptor 23 is positioned at a desired location atop an underlying hollow quartz support 25. Heat is conventionally supplied by inductively coupling the graphite susceptor 23 to an RF induction coil 27 located in the surrounding relationship to the quartz containment vessel. A plurality of graphite mandrels 29, each designed to carry a tubular preform, are supported in parallel alignment upon a lower circular support fixture 31. Each extends upward from one of a plurality of passageways or holes 33 which extend completely through the circular support fixture, as best seen in FIG. 2. Typically 5 to 10 tubular preforms are impregnated at once. The inductive heating of the tubular graphite susceptor 23 causes the region therewithin to be maintained at a suitably high temperature. The individual graphite mandrels, which are preferably solid rods but could be tubes, are also inductively heated, and this heating arrangement results in the coating zone being essentially isothermal.

The desired temperature for the zone is determined by the particular gaseous mixture that is being employed to deposit silicon carbide. Generally, the gaseous atmosphere, which is caused to slowly travel through the coating zone, is a mixture of hydrogen and an alkylchlorosilane, usually one having a plurality of halogen substituents. The preferred silanes are MTS and MDS; however, other equivalent silanes may be employed. The temperature is dependent upon the particular silane that is used, and generally the temperature of the coating zone is maintained between about 1100° C. and about 1200° C., although temperatures in the range of about 1000° C. to about 1500° C. can be used if desired. A volume percent of hydrogen several times that of the silane is employed, and preferably the volume percent of hydrogen is at least about 5 times the volume percent of the silane. Generally, hydrogen will not be employed in an amount more than 20 times that than the volume of silane, and preferably a ratio of hydrogen to silane, by volume, is between about 10 to 1 and about 5 to 1, and most preferably a ratio of between about 6 to 1 and about 8 to 1 is employed.

It is important that, at this relatively low pressure, the flow of the gaseous mixture through the coating zone be maintained at a relatively low flow rate. It has been found that hermetic ceramic structures can be achieved by regulating the flow of the gaseous mixture through the coating zone created by the heated graphite tubular susceptor to at least about twice the diffusion rate of the gaseous mixture in the interstices of the yarn preform and not greater than about 10 times the diffusion rate. If for example, a 7 to 1 mixture of hydrogen/MTS has a diffusion rate of about 50 cm$^3$/min within the preform, then the flow rate should be between about 2 and 10 times that diffusion rate.

Substantially all of the gaseous mixture which enters through the upper inlet 15 to the reactor flows through the graphite susceptor. The arrangement is such that the lower quartz support 25, which also serves to support the circular mandrel support fixture, blocks the exit leading to the vacuum pump via the outlet section 17 so that substantially all of the gaseous material must enter the open upper end of the graphite susceptor 23 and flow therethrough and exit via the lower porous support fixture 31. In general, the supply of the gaseous mixture to the enclosure wherein coating is being carried out is maintained at a rate such that the flow provides, during each minute of coating operation, a volume of gas equal to at least about 100% of the void volume of the subatmospheric pressure coating zone wherein the preform is being heated. For example, if the volume within the graphite susceptor coating zone is equal to about 500 cm$^3$, the rate of flow of the gaseous mixture is preferably maintained between about 500 and about 2,000 cm$^3$ per minute. It is as a result of this arrangement that the fibrous preform, wherein the individual strands of yarn lie in contact with one another and preferably at least somewhat overlap one another, is subjected to isothermal conditions whereunder the gaseous mixture permeates the interstices of the fibrous preform, effectively densifying the planar or tubular region to create a hermetic structure.

To assure this desired effect is achieved, the preform preferably has a thickness not greater than about 1 mm. Generally, the wall thickness of a tubular preform, which is formed by helically winding strands of yarn of a refractory fiber material about a mandrel of circular exterior cross-section, will be between about 0.1 and about 1 mm in thickness. When tubular preforms are used, they are preferably made by helically winding yarn about graphite rods made by Poco graphite PGCS-2, having an outer diameter of about 4 and about 10 mm using a relatively low bias angle, i.e. not more than about 10° from the hoop direction.

Following the completion of impregnation of the porous fibrous preform, flow of the gaseous mixture is continued so that the outer diameter of the preform slowly increases as a layer of dense silicon carbide builds up on the exterior surface thereof. Preferably, the flow of gaseous mixture through the heated deposition zone is continued for a time sufficient to deposit a layer at least about 100 μm thick of silicon carbide exterior of the impregnated preform.

Following the impregnation of the fibrous preform with silicon carbide via CVI, and the optional, but preferred, continued deposition of silicon carbide to create a thin exterior layer of dense, substantially isotropic silicon carbide, the flow of the coating mixture is discontinued, and the power to the reactor is removed, allowing the coated preforms to cool to ambient temperature in an atmosphere of $H_2$. The hermetic silicon carbide composite tubular structure is then removed from the mandrel in an appropriate manner. Preferably, the graphite mandrels are oxidatively removed under conditions that do not oxidize the relatively oxidization-resistant silicon carbide material. The oxidization of the graphite rods can conveniently be carried out in an air-circulating furnace which is heated to a temperature of between about 550° C. and about 750° C. for a time sufficient to oxidize the mandrel leaving the fully densified silicon carbide preforms. Typically, air-oxidization for about two days is sufficient to remove mandrels about 20 cm in length and having a diameter of about 4 mm. After trimming the ends of the tubular composites, they are suitably tested to determine whether they are indeed hermetic.

For purposes of this patent application, a structure is considered to be hermetic when the helium permeability through a square centimeter of the surface at a pressure differential of about 10 MPa is not greater than about $10^{-3}$ cm$^3$ per second. It has been found that, using the manufacturing method as described hereinbefore, silicon carbide structures meeting this criterion can be consistently produced; moreover, by providing a layer of essentially dense silicon carbide adjacent the fully impregnated preform, it is possible to consistently provide structures, such as tubes having an internal diameter in the range of about 4 to 10 mm, which exhibit a permeability to helium at room temperature of less than $8 \times 10^{-5}$ cm$^3$ per second. A preliminary visual test may be used to check for any leaking of such a structure. The tubular or planar structure is installed in a suitable fixture that is pressurized and then immersed in a suitable liquid such as isopropyl alcohol. If the structure, e.g. the fixtured tube, does not exhibit any visible leaks when pressurized with helium at room temperature up to about 20 MPa, it is retained for further leak-tightness testing.

Using a suitable test apparatus, the amount of helium leakage across a surface is measured. This testing shows that structures can be fabricated such that the helium leakage at room temperature and a pressure differential of 20 MPa for a surface of about 10 cm$^2$ is less than about $10 \times 10^{-5}$ cm$^3$/sec. By including an outer wall portion of dense pore-free silicon carbide equal to at least about one-half of the thickness of the original preform, a leak rate of less than 8×10–5 cm$^3$/sec can be achieved. Even when the tube is heated to 1000° C. and pressurized with helium to a pressure differential of about 15 MPa, leak tightness is still observed. Further, testing shows that these structures are likewise resistant to helium permeability under vacuum conditions, which testing is carried out by placing the tube in a helium atmosphere while the interior of the fixtured tube is evacuated and inspecting for the intrusion of helium into the tube. When the interior of the tube is evacuated to a pressure of about $10^{-9}$ Pa, helium entering the interior of the silicon carbide composite tube could not be detected to the detection capability of the measuring instrument; as a result, it is determined that the leak rate under such vacuum conditions is less than $2 \times 10^{-11}$ cm$^3$/sec.

The following example provides one preferred method for making structures embodying various features of the invention. However, it should be understood that the example is for illustrative purposes only and it should not be considered to constitute limitations upon the scope of the invention which is set forth in the claims appended hereto.

A reactor 11 similar to that shown in FIG. 1 is employed which includes a lower outlet section 17 connected to a suitable vacuum pump capable of maintaining a subatmospheric pressure of between about 300 and 400 Pa. Located within the reactor in the region surrounded by the radio frequency (RF) induction coil 27 is a graphite susceptor 23 in the form of a tube of graphite having an ID of about 5 cm, a wall thickness of about 0.5 cm and a length of about 25 cm. It is coaxially positioned within the quartz containment tube 13 which has an ID of about 7.5 cm. The graphite susceptor fits about a lower mandrel support plate or fixture 31 made of graphite which is provided with a multitude of circular cross section passageways 33 that extend completely through this porous plate. A plurality of graphite mandrels 29 having lower ends that are sized to interfit within one of the circular passageways 33 are installed, extending upward as a parallel array from the support fixture where they are located within the confines of the graphite susceptor which creates the coating zone. Mandrels 29 are employed which are about 4 mm in diameter and about 25 cm long.

Before the mandrels are installed, tubular preforms are helically wound around each mandrel using Nicalon yarn in the form of tows, each containing about 500 silicon carbide fibers which are between about 10 µm and 15 µm in diameter. Prior to winding about the mandrels, the Nicalon yarn is coated with pyrolytic carbon; a layer of pyrolytic carbon about 0.2 µm is deposited on each fiber by controlled passage of the yarn through a atmosphere containing about 20 volume % propylene and about 80 volume % H$_2$ at 1200° C. The yarn is wound about the circular cross-section mandrels at a relatively low bias angle. The yarn is wound at a bias angle of between about 5° and 15°, and preferably, the bias angle is not greater than about 10° off of the hoop direction. The winding is carried out such that there is an overlap of about 10% between adjacent strands of yarn in the helical winding. A sufficient number of courses are wound about the mandrel so as to create a tubular preform having a desired wall thickness of about 0.2 mm and a length of just greater than 20 cm. Typically, from about 1 to about 2 courses of the helical wound yarn are employed in making the preform.

For such a tubular preform wound in this manner using Nicalon yarn the diffusion rate of MTS is about 50 cm$^3$/min. The void volume within the coating zone provided by the graphite susceptor is about 350 cm$^3$. The gas supply is accordingly set to supply a 7 to 1, by volume, mixture of hydrogen and MTS at a total gas flow of about 500 cm$^3$/min.

The reactor is evacuated, and then power is supplied to the RF induction coil to raise the temperature within the coating zone to about 1100° C. Next, the desired flow rate of the H$_2$/MTS mixture is established, and SiC deposition begins. After about 8 hours, the coating process is halted, and the preform-carrying mandrels are inverted. Coating is then resumed and continues for another period of about the same length of time. The inversion at about the midway point insures uniformity in impregnation and in ultimate thickness of the additional SiC layer longitudinally along the length of the mandrel in view of the unidirectional flow of the coating atmosphere downward through the coating zone.

Following completion of this period of deposition, the supply of the gaseous mixture is halted, and the coated preforms are allowed to slowly cool in an atmosphere of H$_2$ until they can be removed and transferred to a circulating air furnace. The silicon carbide tubes and graphite mandrels are then heated to about 650° C. and exposed to a steady current of air at ambient pressure for about 48 hours, at the end of which the graphite rods have been completely oxidatively removed from the interior, leaving the silicon carbide composite tubes. Both ends of each tube are trimmed using a diamond saw to prepare them for leak testing. A metal plug is inserted into one end, and a suitable threaded fixture is attached to the other end. Both ends are then sealed with an ultra-low pressure epoxy material, such as that sold under the brand name Torr Seal. The interior of each tube is pressurized using compressed helium. For the room temperature tests, the tubes were immersed in isopropyl alcohol and pressurized with helium. At a pressure of about 20 MPa, no gas bubble formation could be observed on the surface of the SiC tubes, showing that they are macroscopically hermetic. To determine a leak rate, the helium supply was shut off at a pressure of precisely 20 MPa, and the decrease in pressure was then monitored over a 24-hour period. It was calculated that a change in pressure equal to about 1000 Pa would correspond to a leak rate of about $8 \times 10^{-5}$ cm$^3$/sec. A drop in pressure of less than this amount was observed for each of the tubes.

To test the permeability of the tubes at elevated temperature, a heating element is provided by forming a Nichrome wire into a coil about the exterior surface of each tube. To test for whether the tubes were hermetic at elevated temperatures, the fixture ends were water-cooled while the central body portion of each of the silicon carbide tubes was heated using this Nichrome heater; the temperature of the SiC composite tube was determined by a micro optical pyrometer. An internal pressure of about 15 MPa of helium was established, and helium supply was cut off. The temperature was maintained at 1000° C. for 24 hours, while internal pressure was monitored. Again, the pressure decreased less than 1000 Pa, showing the tubes are indeed hermetic.

A further testing of the composite tubes was carried out for performance under vacuum conditions at room temperature. Each tube was placed in a helium atmosphere, and the interior of the tube was evacuated to about $10^{-9}$ Pa while maintaining 1 atmosphere pressure of helium surrounding the tube. Helium was not detected inside the tube within the detection limit of the instrument. As a result, it was determined that the leak rate under such vacuum conditions was less than $2 \times 10^{-11}$ cm$^3$/sec.

Following testing, the composite tubes were cut to provide polished cross-sections that could be examined by scanning electron microscopy. The microstructure of the filament-wound tubes was shown to consist of two distinct regions. The interior portion of the composite tube contains the Nicalon fibers embedded in a SiC matrix, and the fiber volume of this region, which has a radial thickness of about 150 µm, is about 50 volume %. The remaining outer portion of the composite tube wall consists of dense, pore-free silicon carbide and has a radial thickness of about 100 µm.

The composite tubes are considered to be hermetic and well-suited for containing a relatively high pressure of helium; they are considered to be excellently suited for use in heat exchange operations for fusion and fission reactors and the like where the high temperature stability and favorable nuclear characteristics of silicon carbide provide significant advantages. Thus, the invention provides methods for efficiently producing composite structures which are gas-tight not only at room temperature but at elevated temperatures and which are suitable for use in high neutron flux environments.

Although the invention has been described in a manner to set forth the best mode presently contemplated by the inventors, it should be understood that various changes and modifications as would be obvious to one having the ordinary skill in this art may be made without departing from the scope of the invention which is defined by the claims appended hereto. For example, as previously indicated, although silicon carbide fiber yarn is preferred, it should be understood that yarns made of other refractory fiber materials which are compatible with a silicon carbide matrix can be employed to provide similar hermetic composite structures.

Particular features of the invention are emphasized in the claims which follow.

What is claimed is:

1. A method for making a hermetic silicon carbide (SIC) structure by chemical vapor infiltration (CVI), which method comprises
   creating a fibrous preform with strands of yarn of refractory-fiber material.
   locating said preform in an essentially isothermal high temperature subatmospheric pressure zone wherein the pressure is maintained at about 700 Pa or less,
   creating a flow of a gaseous mixture of hydrogen ($H_2$) and an alkyl chlorosilane through said zone at a flow rate equal to at least about two times the rate at which said gaseous mixture diffuses into said preform and not greater than about 10 times thereof, said gaseous substance reacting at said temperature to deposit SiC throughout said yarn, and
   maintaining said flow through said zone until said preform becomes impregnated with SiC to such an extent that it has a helium permeability through one square centimeter of surface area not greater than about $1 \times 10^{-3}$ cm$^3$ per second at a pressure differential of about 10 MPa.

2. A method according to claim 1 wherein said mixture contains methyltrichlorosilane ($CH_3SiCl_3$) and $H_2$, having $H_2$ in a volume % between about 5 and about 20 times the volume % of $CH_3SiCl_3$.

3. A method according to claim 2 wherein said mixture contains $H_2$ in a volume % between about 6 and about 8 times the amount of $CH_3SiCl_3$.

4. A method according to claim 3 wherein said preform is maintained at a temperature between about 1000° C. and about 1500° C.

5. A method according to claim 4 wherein said flow rate of said gaseous mixture is maintained between about 500 and about 2000 cm$^3$/min relative to a zone having a volume of about 500 cm$^3$.

6. A method according to claim 4 wherein said gaseous mixture is supplied at a flow rate such that a volume equal to at least about 100% of the void volume of the subatmospheric pressure zone wherein said preform is being heated is supplied to said zone each minute.

7. A method according to claim 1 wherein said fibers are made of SiC carbon, silicon oxycarbide, silicon nitride, silicon oxynitride or aluminum oxide.

8. A method according to claim 1 wherein said individual fibers constituting said yarn are SiC fibers which have interfacial coatings of carbon at least about 0.1 μm thick.

9. A method according to claim 1 wherein adjacent strands of said yarn in said preform overlap each other by an amount between about 0% and about 50% of the width of said strands.

10. A method according to claim 1 wherein said strands of yarn are relatively flat in shape and said adjacent strands overlap each other by an amount at least about 50% of the width of said strands in said preform.

11. A method according to claim 1 wherein said preform has a thickness of not greater than about 2 mm.

12. A method according to claim 1 wherein said preform is tubular in shape and is formed by helically winding strands of said yarn about a mandrel of circular cross section.

13. A method according to claim 12 wherein the exterior diameter of said mandrel is between about 4 and about 10 mm and the wall thickness of said tubular preform is between about 0.2 and about 1 mm.

14. A method according to claim 12 wherein, following impregnation of said preform with silicon carbide, said flow of said gaseous mixture through said zone is continued for a time sufficient to deposit at least about 100 μm of silicon carbide exterior of said impregnated preform.

15. A method according to claim 13 wherein said mandrel is formed of graphite having a coefficient of thermal expansion within about 10% of that of silicon carbide.

16. A method according to claim 12 wherein said flow is maintained for a time sufficient to deposit a thickness of silicon carbide at least about equal to the wall thickness of said preform.

17. A method according to claim 1 wherein the individual fibers of said yarn are made of SiC and are coated with at least about 0.1 μm of carbon by deposition from a vaporous atmosphere, wherein said yarn made of said coated fibers is wound about a graphite mandrel to form said preform having a tubular shape, and wherein, following said impregnation, said graphite mandrel is eliminated by oxidative removal under conditions wherein said silicon carbide is not oxidized.

18. A method for making a hermetic silicon carbide (SiC) tubular structure by chemical vapor infiltration (CVI), which method comprises
    creating a fibrous tubular preform by winding strands of SIC fibrous yarn about a mandrel, with individual fibers constituting said yarn having coatings of carbon at least about 0.1 μm thick.
    locating said tubular preform and said mandrel in a high temperature subatmospheric pressure zone wherein the pressure is maintained at about 700 Pa or less and the temperature between about 1000° C. and about 1500° C.,
    creating a flow of a mixture of hydrogen and an alkyl chlorosilane which is gaseous at said high temperature through said zone at a flow rate equal to at least about two times the rate at which said mixture diffuses into said preform and not greater than about 10 times thereof, said silane decomposing at said high temperature to deposit SiC throughout said yarn, and
    maintaining said flow through said zone until said preform becomes impregnated with SiC and has a helium permeability through one square centimeter of surface area not greater than about $1 \times 10^{-3}$ cm$^3$ per second at a pressure differential of about 10 MPa.

19. A method according to claim 18 wherein the diameter of said mandrel is between about 4 and about 10 mm, the wall thickness of said tubular preform is between about 0.1 and 2 mm, and said flow and decomposition are maintained for a time sufficient to deposit an outer layer of silicon carbide having a thickness at least about 100 μm.

20. A method for making a hermetic silicon carbide (SIC) tubular structure by chemical vapor infiltration (CVI), which method comprises creating a fibrous tubular preform by winding strands of SiC fibrous yarn about a mandrel, with individual fibers constituting said yarn having coatings of pyrolytic carbon at least about 0.1 μm thick, locating said tubular preform and said mandrel in an essentially isothermal, subatmospheric pressure zone wherein the pressure is maintained at about 700 Pa or less and the temperature is maintained at between about 1000° C. and about 1500° C., creating a flow of a gaseous mixture of hydrogen and methyltrichlorosilane or methyldichlorosilane, in which hydrogen is present in an amount at least about 5 times the volume of chlorosilane, through said zone and past the exterior surface of said tubular preform at a flow rate equal to at least about twice the rate at which said mixture diffuses into said preform and not greater than about 10 times thereof, said chlorosilane decomposing at said temperature to deposit SiC throughout said yarn, and maintaining said flow through said zone past said preform until said preform becomes impregnated with SiC and has a helium permeability through one square centimeter of surface area not greater than about $1 \times 10^{-3}$ cm$^3$ per second at a pressure differential of about 10 MPa.

* * * * *

UNITED STATES PATENT AND TRADEMARK OFFICE
CERTIFICATE OF CORRECTION

PATENT NO. : 5,681,511
DATED : October 28, 1997
INVENTOR(S) : Streckert, et al.

It is certified that error appears in the above-identified patent and that said Letters Patent is hereby corrected as shown below:

IN THE CLAIMS:
Column 9, line 19, change "(SIC)" to --(SiC)--.

Column 10, line 39, change "SIC" to --SiC--.
Column 10, line 65, change "(SIC)" to --(SiC)--.

Signed and Sealed this

Twenty-first Day of April, 1998

Attest:

BRUCE LEHMAN

*Attesting Officer*          *Commissioner of Patents and Trademarks*